United States Patent
Yamada et al.

(10) Patent No.: US 12,339,327 B2
(45) Date of Patent: *Jun. 24, 2025

(54) BATTERY MONITORING SYSTEM

(71) Applicant: DENSO CORPORATION, Kariya (JP)

(72) Inventors: Ichiro Yamada, Kariya (JP); Nobuo Yamamoto, Kariya (JP); Shuhei Yoshida, Kariya (JP)

(73) Assignee: DENSO CORPORATION, Kariya (JP)

( * ) Notice: Subject to any disclaimer, the term of this patent is extended or adjusted under 35 U.S.C. 154(b) by 206 days.

This patent is subject to a terminal disclaimer.

(21) Appl. No.: 16/284,336

(22) Filed: Feb. 25, 2019

(65) Prior Publication Data

US 2019/0265309 A1  Aug. 29, 2019

(30) Foreign Application Priority Data

Feb. 28, 2018  (JP) .................................. 2018-034310
Feb. 21, 2019  (JP) .................................. 2019-029055

(51) Int. Cl.
*G01R 31/396* (2019.01)
*G01R 31/382* (2019.01)
*H01M 10/48* (2006.01)

(52) U.S. Cl.
CPC ......... *G01R 31/396* (2019.01); *G01R 31/382* (2019.01); *H01M 10/482* (2013.01); *H01M 2220/20* (2013.01)

(58) Field of Classification Search
CPC .................................................. G01R 31/396
See application file for complete search history.

(56) References Cited

U.S. PATENT DOCUMENTS 9,237,459 B1 *  1/2016  Erell .................... H04B 17/309
2004/0251875 A1 * 12/2004  Kinoshita .......... G01R 31/3842
                                                                    320/136

(Continued)

FOREIGN PATENT DOCUMENTS

JP     2016-152704 A    8/2016
JP     2017-138241 A    8/2017

(Continued)

OTHER PUBLICATIONS

Rosasco, "Sparsity Based Regularization," 9.520 Class 11, Mar. 11, 2009. Accessed at https://www.mit.edu/~9.520/spring09/Classes/class11_sparsity.pdf.

(Continued)

*Primary Examiner* — Hyun D Park
(74) *Attorney, Agent, or Firm* — Oliff PLC

(57) ABSTRACT

A battery monitoring system monitors states of at least two secondary batteries. In the system, a data acquiring unit acquires a plurality of types of monitoring data to monitor the state of each of the secondary batteries. A failure determining unit determines whether the secondary battery has failed. The failure determining unit performs sparsity regularization using the acquired monitoring data of each of the secondary batteries as variables and calculates a partial correlation coefficient matrix of the monitoring data. The failure determining unit calculates, as an abnormality level, a difference in a partial correlation coefficient, which is a component of the partial correlation coefficient matrix, between two partial correlation coefficient matrices respectively calculated using the monitoring data of the two secondary batteries. The failure determining unit determines that either of the two secondary batteries has failed when the calculated abnormality level exceeds a predetermined threshold.

5 Claims, 18 Drawing Sheets

(56) References Cited

U.S. PATENT DOCUMENTS

| | | | | |
|---|---|---|---|---|
| 2013/0015982 | A1* | 1/2013 | Matsumoto | G06Q 50/06 340/870.02 |
| 2015/0048838 | A1 | 2/2015 | Ose | |
| 2015/0149015 | A1 | 5/2015 | Nakano et al. | |
| 2016/0169978 | A1* | 6/2016 | Fukuhara | H02J 7/0026 324/434 |
| 2016/0252586 | A1* | 9/2016 | Shimura | H01M 10/446 702/63 |
| 2018/0270132 | A1 | 9/2018 | Hashimoto et al. | |
| 2018/0285317 | A1 | 10/2018 | Nishida et al. | |
| 2018/0348728 | A1 | 12/2018 | Ota et al. | |
| 2018/0357539 | A1 | 12/2018 | Hwang et al. | |
| 2019/0018397 | A1 | 1/2019 | Shiba et al. | |
| 2019/0265309 | A1 | 8/2019 | Yamada et al. | |
| 2019/0310321 | A1 | 10/2019 | Mi et al. | |
| 2020/0342359 | A1 | 10/2020 | Hu et al. | |
| 2020/0380371 | A1 | 12/2020 | Ding et al. | |

FOREIGN PATENT DOCUMENTS

| | | |
|---|---|---|
| JP | 2017-139911 A | 8/2017 |
| JP | 2019-152656 A | 9/2019 |

OTHER PUBLICATIONS

Friedman et al., "Sparse inverse covariance estimation with the graphical lasso," Biostatistics (2008), 9, 3, pp. 432-441. Accessed at https://doi.org/10.1093/biostatistics/kxm045.

Williams et al., Back to the Basics: Rethinking Partial Correlation Network Methodology, PsyArXiv, Apr. 7, 2018, pp. 1-15.

Lafit et al., "A Partial Correlation Screening Approach for Controlling the False Positive Rate in Sparse Gaussian Graphical Models," Scientific Reports (2019), 9:17759, pp. 1-24. Accessed at https://www.nature.com/articles/s41598-019-53795-x.

Ide et al., "Proximity-Bases Anomoly Detection Using Sparse Structure Learning," Tokyo Research Laboratory, Apr. 2009, pp. 1-16. Accessed at https://ide-research.net/papers/2009_SDM_a_Ide.ppt.

U.S. Appl. No. 16/284,442, filed Feb. 25, 2019 in the name of Yamada et al.

Mar. 31, 2021 Office Action issued in U.S. Appl. No. 16/284,442.

Wikipedia, Partial correlation, printed Oct. 27, 2021. (Year: 2021).

Wikipedia, Structured sparsity regularization, printed Oct. 27, 2021. (Year: 2021).

Nov. 16, 2021 Office Action issued in U.S. Appl. No. 16/284,442.

Jun. 24, 2022 Office Action issued in U.S. Appl. No. 16/284,442.

Kawano, S; "Regression modeling base on sparse regularization and its computational algorithms (Statistics One Point);" Japanese Society of Computational Statics; 33(2); pp. 173-186; 2017.

Ide, T; "A story of graphical lasso that adds sparsity to the dependency;" Iwanami Data Science; vol. 5; pp. 48-63; Nov. 26, 2016.

Kawano, S. et al; "Statistical modeling with sparse estimation method;" Kyoritsu Shuppan Co., LTD.; pp. 4-6, 20-21, 105-115; Mar. 15, 2018.

Ide et al; "Proximity-bases anomaly detection using sparce structure learning;" Proceedings of 2009 SIAM International Conference on Data Mining (SDM 09, Apr. 30-May 2, Sparks, USA); pp. 97-108.

* cited by examiner

SOC≃100%

BATTERY MONITORING SYSTEM

CROSS-REFERENCE TO RELATED APPLICATION

This application is based on and claims the benefit of priority from Japanese Patent Application No. 2018-034310, filed Feb. 28, 2018 and Japanese Patent Application No. 2019-029055, filed Feb. 21, 2019. The entire disclosures of the above applications are incorporated herein by reference.

BACKGROUND

Technical Field

The present disclosure relates to a battery monitoring system.

Related Art

A battery monitoring system has been known, in which fault diagnosis of a secondary battery is performed using an open circuit voltage (OCV) and a state of charge (SOC) of the secondary battery. As another example, there is a method for performing fault diagnosis using capacity of the secondary battery.

SUMMARY

An exemplary embodiment of the present disclosure provides a battery monitoring system in which a plurality of types of monitoring data are acquired to monitor the state of each of at least two secondary batteries and determine whether the secondary battery has failed. The battery monitoring system performs sparsity regularization using the acquired monitoring data of each of the secondary batteries as variables and calculates a partial correlation coefficient matrix of the monitoring data. The battery monitoring system calculates, as an abnormality level, a difference in a partial correlation coefficient, which is a component of the partial correlation coefficient matrix, between two partial correlation coefficient matrices respectively calculated using the monitoring data of the two secondary batteries. The battery monitoring system determines that either of the two secondary batteries has failed when the calculated abnormality level exceeds a predetermined threshold.

DESCRIPTION OF THE EMBODIMENTS

Figure 1:
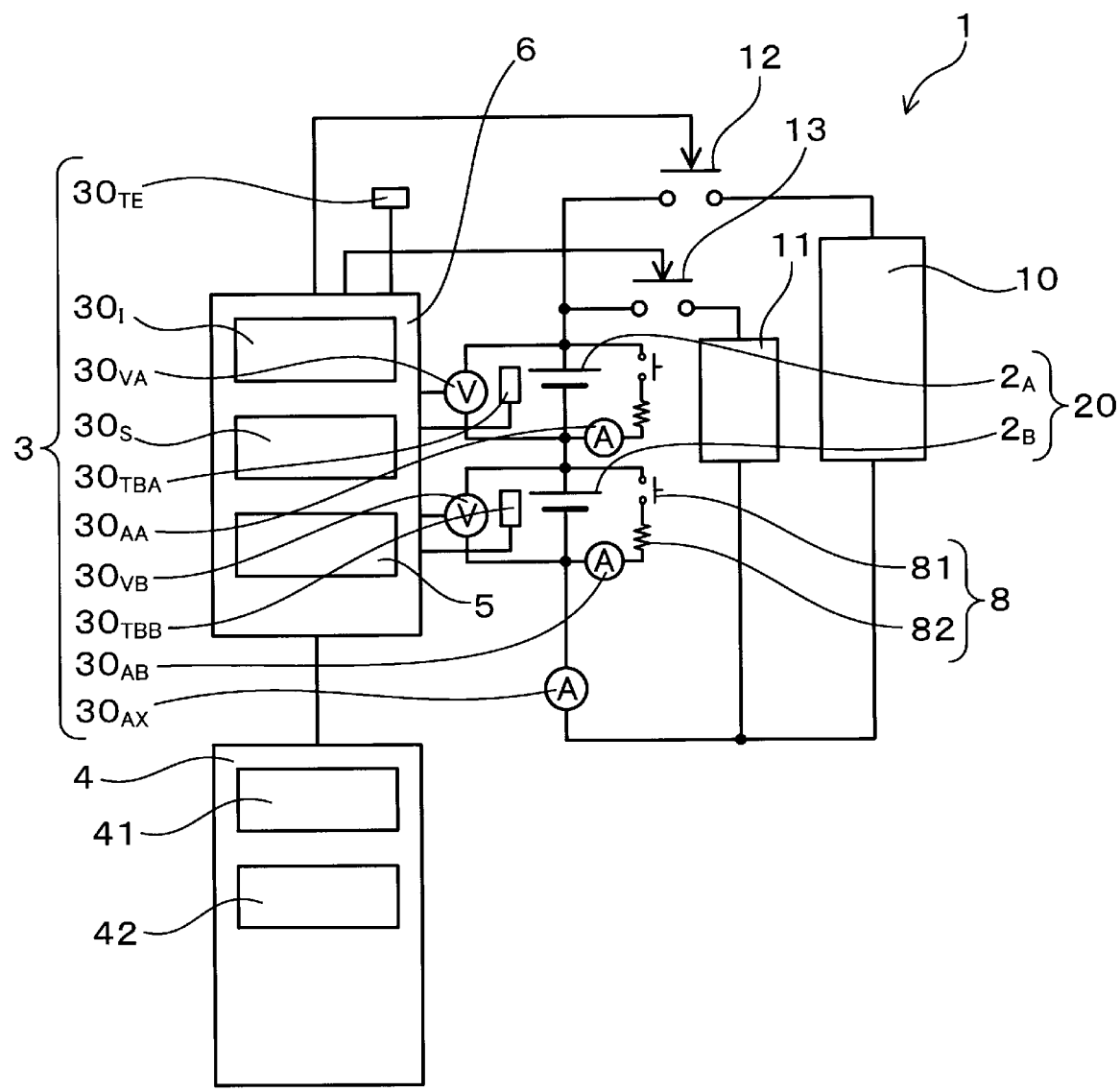
FIG. 1 is a circuit diagram of a battery monitoring system according to a first embodiment.

The following embodiments relate to a battery monitoring system that performs fault diagnosis of a secondary battery.

A battery monitoring system that performs failure diagnosis of a secondary battery has been known. For example, in this battery monitoring system, an open circuit voltage (OCV) and a state of charge (SOC) of the secondary battery are periodically measured. The measurement values of the OCV and the SOC are then cumulatively stored. When a relationship between the OCV and the SOC that have been newly measured has significantly changed compared to a relationship between the OCV and the SOC that have been previously measured, the secondary battery is determined to have failed.

In addition, as another example of fault diagnosis, there is a method in which the capacity of the secondary battery is measured. In this case, first, the secondary battery is fully discharged. Subsequently, the secondary battery is fully charged. Then, the capacity of the secondary battery is measured through measurement of the charge amount required for charging. When the value of the capacity that has been newly measured has significantly changed compared to the value of the capacity that has been previously measured, the secondary battery is determined to have failed.

However, in the method in which the OCV and the SOC are measured, and failure determination is performed based on whether the relationship between the OCV and the SOC has changed compared to the relationship between previous measurement values, the measurement values of the OCV and the SOC are required to be cumulatively stored. As a result, the amount of data that is stored becomes large and a large-volume storage apparatus is required. Furthermore, failure determination is difficult to perform until the secondary battery has completely failed. That is, initial stage of failure of the battery is difficult to detect.

Moreover, when failure determination is performed through measurement of the capacity of the secondary battery, an issue in that a large amount of time is required for measurement of the capacity arises.

It is thus desired to provide a battery monitoring system that is capable of detecting initial stage of failure of a secondary battery, reducing an amount of data to be stored, and performing failure determination in a small amount of time.

An exemplary embodiment provides a battery monitoring system that monitors states of at least two secondary batteries. The battery monitoring system includes a data acquiring unit and a failure determining unit. The data acquiring unit acquires a plurality of types of monitoring data to monitor the state of each of the secondary batteries. The failure determining unit determines whether the secondary battery has failed. The failure determining unit includes a matrix calculating unit and an abnormality level calculating unit. The matrix calculating unit performs sparsity regularization using the acquired monitoring data of each of the secondary batteries as variables and calculates a partial correlation coefficient matrix of the monitoring data. The abnormality level calculating unit calculates, as an abnormality level, a difference in a partial correlation coefficient, which is a component of the partial correlation coefficient matrix, between two partial correlation coefficient matrices respectively calculated using the monitoring data of the two secondary batteries. The failure determining unit is configured to determine that either of the two secondary batteries has failed when the calculated abnormality level exceeds a predetermined threshold.

The failure determining unit of the above-described battery monitoring system performs sparsity regularization using the monitoring data of the secondary battery as variables and calculates the partial correlation coefficient matrix. Then, the failure determining unit calculates, as the abnormality level, the difference in the partial correlation coefficient between the two partial correlation coefficient matrices respectively calculated using the two secondary batteries. The failure determining unit determines that either of the two secondary batteries has failed when the abnormality level exceeds the threshold.

As a result, initial stage of failure of the secondary battery can be detected. That is, when sparsity regularization is performed, two types of monitoring data that have a high correlation can be selected among the plurality of types of monitoring data of the secondary battery. That is, when two types of monitoring data have a high correlation, the absolute value of the partial correlation coefficient becomes closer to 1. In addition, when two types of monitoring data have a low correlation, the absolute value of the partial correlation coefficient becomes closer to 0.

Therefore, when the two secondary batteries are compared and the partial correlation coefficients respectively included in the partial correlation coefficient matrices of the two secondary batteries significantly differ, this means that the combination of two types of monitoring data that have a high correlation differs between the two secondary batteries. Therefore, in this case, a determination that a failure of some sort has occurred in either of the two secondary batteries can be made. In particular, the partial correlation coefficient significantly changes even when an initial stage of failure occurs in the secondary battery. Therefore, initial stage of failure of the secondary battery can be detected through use of the change in the partial correlation coefficient.

In addition, the above-described battery monitoring system is capable of performing failure detection without being required to store all pieces of monitoring data acquired in the past, as long as only the pieces of monitoring data required for the calculation of the partial correlation coefficient matrices are stored. Therefore, the amount of data to be stored can be reduced. Moreover, compared to cases where the capacity of the secondary battery is measured, the above-described battery monitoring system can perform failure determination of the secondary battery in a small amount of time.

As described above, according to the above-described exemplary embodiment, a battery monitoring system that is capable of detecting initial stage of failure of a secondary battery, reducing an amount of data to be stored, and performing failure determination in a small amount of time can be provided.

First Embodiment

A first embodiment of the above-described battery monitoring system will be described with reference to FIG. 1 to FIG. 12. As shown in FIG. 1, a battery monitoring system 1 according to the present embodiment monitors the states of at least two secondary batteries 2 ($2_A$ and $2_B$). The battery monitoring system 1 includes a data acquiring unit 3 and a failure determining unit 4. For each of the secondary batteries 2, the data acquiring unit 3 acquires a plurality of types of monitoring data $X_1$ to $X_n$ that are used to monitor the state of the secondary battery 2. The failure determining unit 4 determines whether the secondary battery 2 has failed.

The failure determining unit 4 includes a matrix calculating unit 41 and an abnormality level calculating unit 42. For each of the secondary batteries 2 ($2_A$ and $2_B$), the matrix calculating unit 41 performs sparsity regularization using the acquired monitoring data $X_1$ to $X_n$ as variables. The matrix calculating unit 41 thereby calculates a partial correlation coefficient matrix $\Lambda$ of the monitoring data $X_1$ to $X_n$. The abnormality level calculating unit 42 calculates, as an abnormality level $\Delta$, a difference in a partial correlation coefficient $\lambda$ between two partial correlation matrices $\Lambda$ that have been respectively calculated using the monitoring data of the two secondary batteries $2_A$ and $2_B$. When the calculated abnormality level $\Delta$ exceeds a predetermined threshold $\Delta_{TH}$, the failure determining unit 4 determines that either of the two secondary batteries $2_A$ and $2_B$ has failed.

The battery monitoring system 1 according to the present embodiment is an onboard battery monitoring system that is mounted in a vehicle, such as an electric vehicle or a hybrid vehicle. As shown in FIG. 1, according to the present embodiment, the two secondary batteries $2_A$ and $2_B$ are connected to each other in series and configure an assembled battery (battery pack) 20. A load 10 and a charging apparatus 11 are connected to the assembled battery 20. The load 10 according to the present embodiment is an inverter. Direct-current power provided by the assembled battery 20 is converted to alternating-current power through use of the inverter, and a three-phase alternating current motor (not shown) is thereby driven. As a result, the vehicle is made to drive.

A discharge switch 12 is arranged between the load 10 and the assembled battery 20. In addition, a charging switch 13 is arranged between the charging apparatus 11 and the assembled battery 20. A control unit 6 controls on/off operations of the switches 12 and 13. When the assembled battery 20 is charged, the control unit 6 turns on the charging switch 13. When the load 10 is driven, the control unit 6 turns on the discharge switch 12.

In addition, a discharge circuit 8 is connected to each of the secondary batteries 2. Each discharge circuit 8 is configured by an individual discharge switch 81 and a discharge resistor 82. When the respective stage of charge (SOC) of the two secondary batteries 2 are not equal, the control unit 6 turns on the individual discharge switch 81 and individually discharges the secondary battery 2. As a result, the respective SOC of the two secondary batteries 2 are made equal.

As the monitoring data of each secondary battery 2, the data acquiring unit 3 according to the present embodiment acquires a closed circuit voltage (CCV), a charge current $I_C$, a discharge current $I_D$, the SOC, a battery temperature $T_B$, an integrated charging time $\Sigma t_c$, an integrated discharge time $\Sigma t_d$, an integrated charge current $\Sigma I_C$, an integrated discharge current $\Sigma I_D$, an environmental temperature $T_E$ of the periphery, and the like of each secondary battery 2.

The data acquiring unit 3 includes a current sensor $30_A$ ($30_{AA}$, $30_{AB}$, and $30_{AX}$), a voltage sensor $30_V$ ($30_{VA}$ and $30_{VB}$), a battery temperature sensor $30_{TB}$ ($30_{TBA}$ and $30_{TBB}$), an environment temperature sensor $30_{TE}$, an integrating unit $30_I$, and a SOC calculating unit $30_S$. The current sensor $30_A$ measures the charge current $I_C$ or the discharge current $I_D$. The battery temperature sensor $30_{TB}$ measures the battery temperature $T_B$. The environment temperature sensor $30_{TE}$ measures the environmental temperature $T_E$. The voltage sensor $30_V$ measures the CCV and the OCV of the secondary battery 2. The SOC calculating unit $30_S$ calculates the SOC of the secondary battery 2 using the measurement value of the OCV.

In addition, the integrating unit $30_I$ calculates an integrated temperature stress $\Sigma T$, the integrated charging time $\Sigma t_c$, the integrated discharge time $\Sigma t_d$, the integrated charge current $\Sigma I_C$, and the integrated discharge current $\Sigma I_D$. The integrated charging time $\Sigma t_c$ is an integration value of a charging time $t_c$ of the secondary battery 2. The integrated discharge time $\Sigma t_d$ is an integration value of a discharge time $t_d$ of the secondary battery 2. The integrated charge current $\Sigma I_C$ is an integration value of the charge current $I_C$. Furthermore, the integrated temperature stress $\Sigma T$ is an integration value of an amount of time at each temperature during use. For example, the integrated temperature stress $\Sigma T$ can be calculated in the following manner: $\{10°\ C.\times time\}+\{15°\ C.\times time\}+\ldots+\{45°\ C.\times time\}$. In addition, because a greater amount of stress is applied to the secondary battery 2 as the temperature increases, weight may be applied to the amounts of time. The method for calculating the integrated temperature stress $\Sigma T$ is not limited thereto. For example, a method in which only the amounts of time at which the temperature is 40° C. or higher are counted and integrated can also be used.

The battery monitoring system 1 according to the present embodiment also includes a storage unit 5. The storage unit 5 stores therein the pieces of monitoring data required for calculation of the above-described partial correlation coefficient matrices $\Lambda$ and the calculated partial correlation coefficient matrices $\Lambda$.

In addition, according to the present embodiment, a lithium battery is used as each of the secondary batteries $2_A$ and $2_B$. The structures of the secondary batteries $2_A$ and $2_B$, and the materials used for electrodes and the like are the same.

Figure 9:
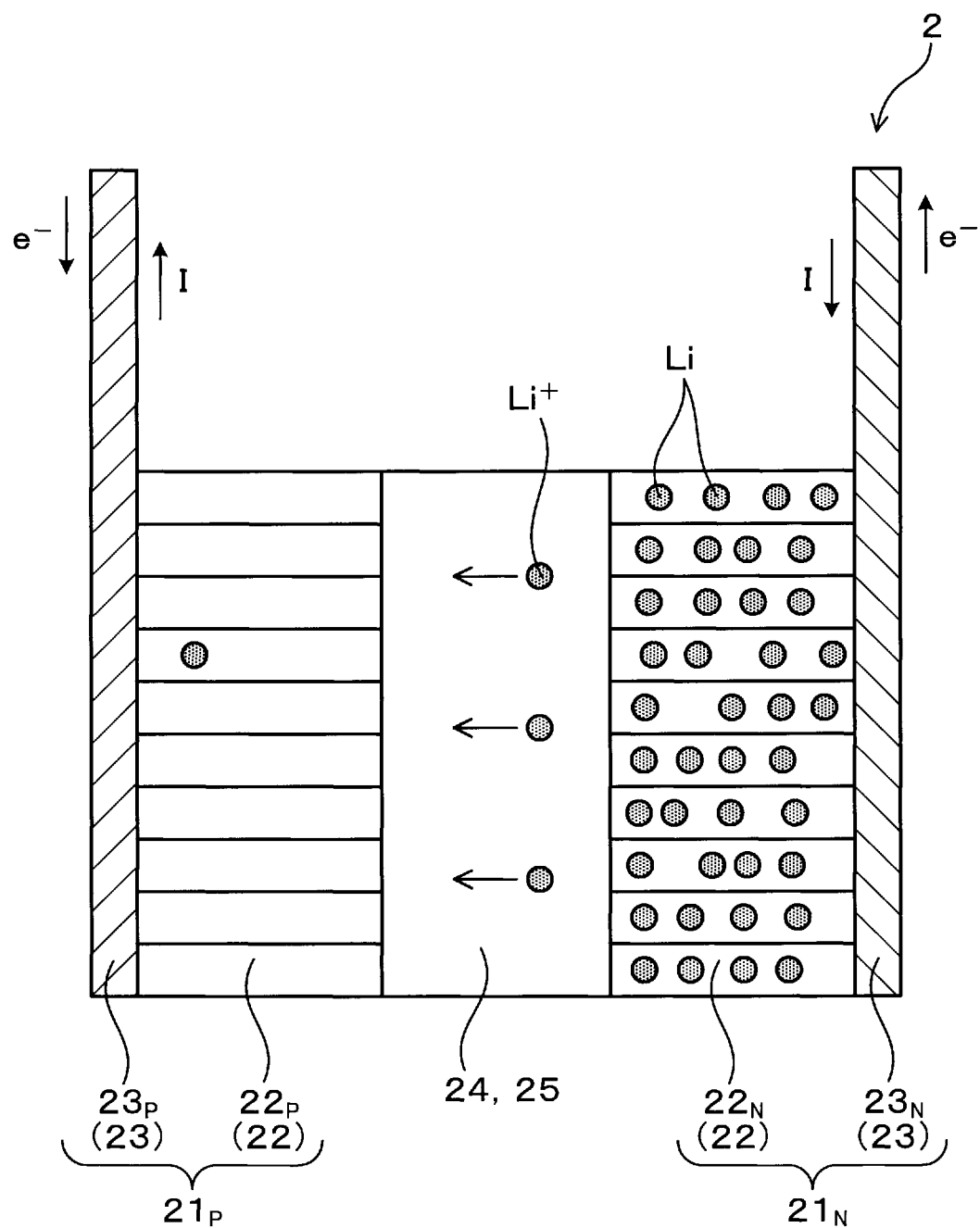
FIG. 9 is a conceptual diagram of a secondary battery during discharge, according to the first embodiment.

Next, the structure of the secondary battery 2 will be described in further detail. As shown in FIG. 9, the secondary battery 2 includes a positive electrode $21_P$, a negative electrode $21_N$, a separator 24, and an electrolyte 25. The separator 24 is disposed between the positive electrode $21_P$ and the negative electrode $21_N$. The positive electrode $21_P$ and the negative electrode $21_N$ each include a metal current collector 23 ($23_P$ and $23_N$) and an active material 22 ($22_P$ and $22_N$) that is attached to the current collector 23.

Figure 10:
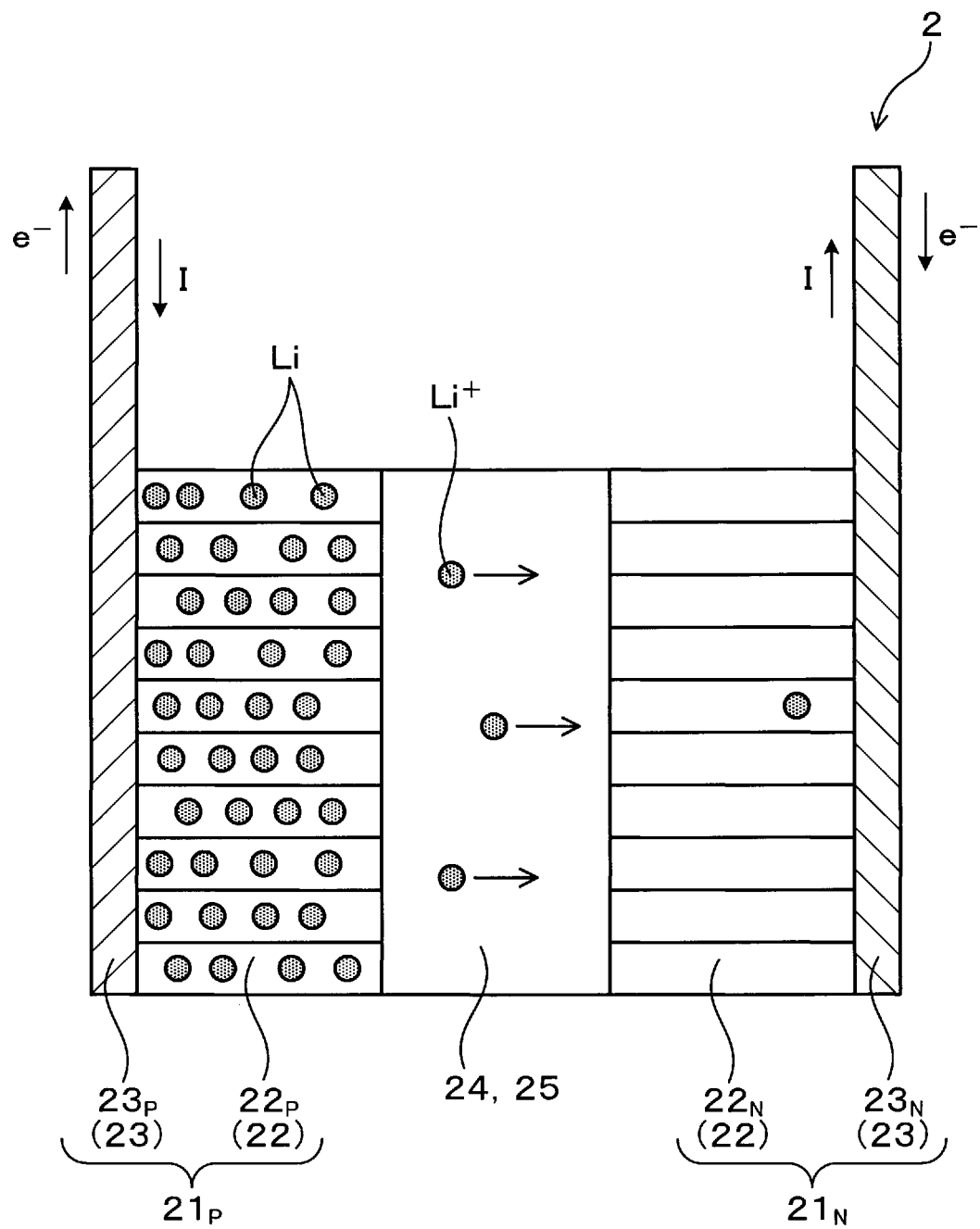
FIG. 10 is a conceptual diagram of the secondary battery during charging, according to the first embodiment.

As shown in FIG. 9, when the SOC of the secondary battery 2 is substantially 100%, most of the lithium ions are present in the active material $22_N$ of the negative electrode $21_N$. When discharge is performed, the lithium ions move to the active material $22_P$ of the positive electrode $21_P$. In addition, as shown in FIG. 10, when the SOC of the secondary battery 2 is substantially 0%, most of the lithium ions are present in the active material $22_P$ of the positive electrode $21_P$. When charging is performed, the lithium ions move to the active material $22_N$ of the negative electrode $21_N$.

When an external impact or the like is applied to the secondary battery 2, failure may occur in the secondary battery 2. For example, the respective current collector 23 ($23_P$ and $23_N$) of the electrodes 21 ($21_P$ and $21_N$) may come into contact with each other. Alternatively, the active material 22 may separate from the current collector 23. Furthermore, when the secondary battery 2 is used for a long period of time, deposition of metallic lithium into the electrolyte 25 may occur and short-circuiting between the pair of electrodes 21 may occur. The failure determining unit 4 according to the present embodiment determines whether such failures have occurred in the secondary battery 2.

Figure 2:
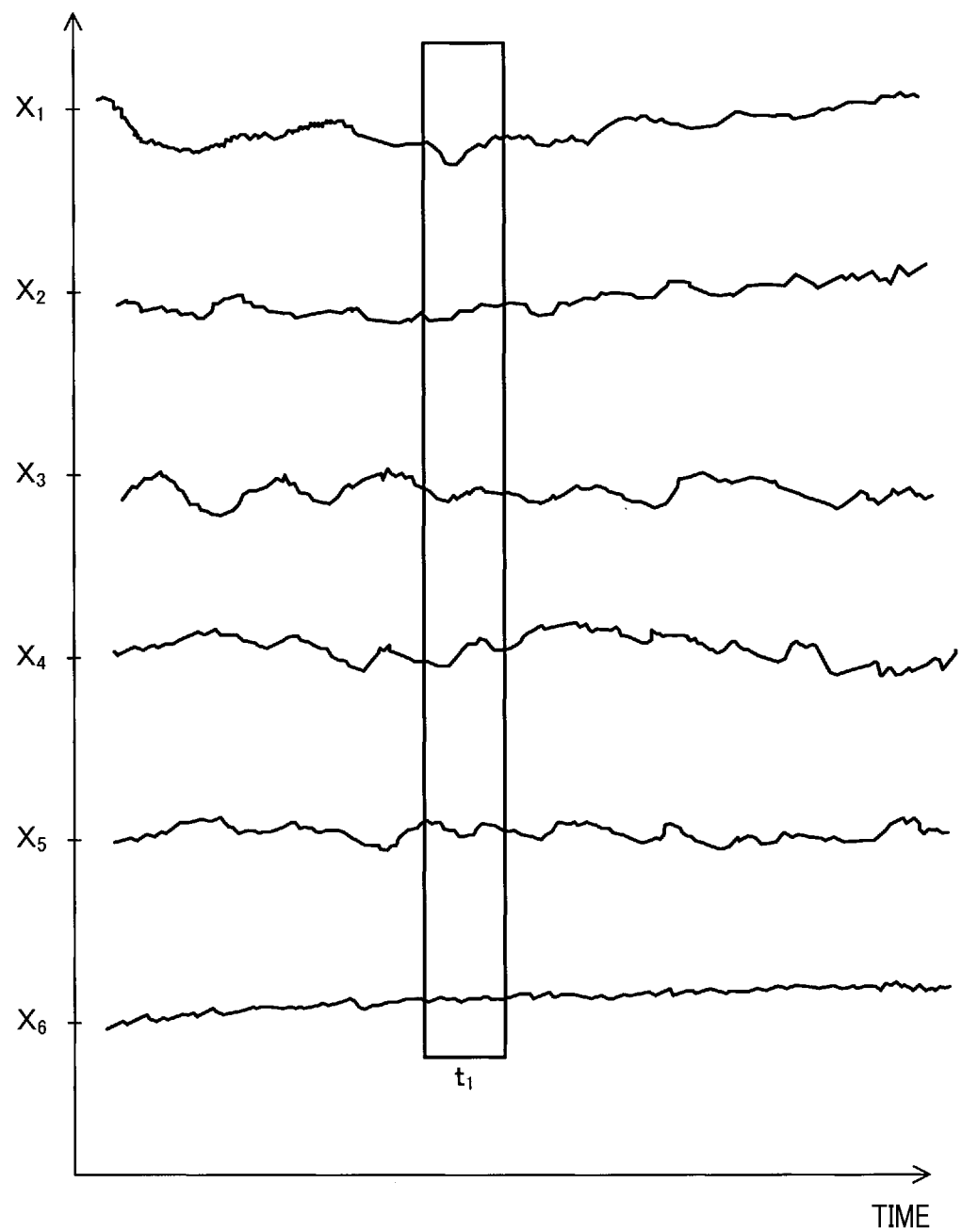
FIG. 2 is a graph of changes with time in monitoring data of a first secondary battery according to the first embodiment.

Next, a method for performing the fault diagnosis of the secondary battery 2 will be described with reference to FIG. 2 to FIG. 8. Here, as shown in FIG. 2, a case in which six types of monitoring data $X_1$ to $X_6$ are used will be described. For example, first monitoring data $X_1$ is the CCV. Second monitoring data $X_2$ is the discharge current $I_D$. Third monitoring data $X_3$ is the SOC. Fourth monitoring data $X_4$ is the battery temperature $T_B$. Fifth monitoring data $X_5$ is the integrated discharge time $\Sigma t_D$. Sixth monitoring data $X_6$ is the integrated discharge current $\Sigma I_D$. Other types of monitoring data X may also be used. The order of the types of monitoring data X is arbitrary. Furthermore, although six types of monitoring data $X_1$ to $X_6$ are used in FIG. 2 and the like, the present disclosure is not limited thereto. Two or more types of monitoring data X may be used.

As shown in FIG. 2, the value of each of the monitoring data $X_1$ to $X_6$ changes with the passage of time. First, the failure determining unit 4 performs sparsity regularization using the monitoring data $X_1$ to $X_6$ of the first secondary battery $2_A$ (see FIG. 1) as the variables. The failure determining unit 4 thereby calculates a first partial correlation coefficient matrix $\Lambda_1$. For example, the first partial coefficient matrix $\Lambda_1$ can be expressed in the following manner.

[Formula 1]

$$\Lambda_1 = \begin{bmatrix} & \lambda_{12} & \lambda_{13} & \lambda_{14} & \lambda_{15} & \lambda_{16} \\ & & \lambda_{23} & \lambda_{24} & \lambda_{25} & \lambda_{26} \\ & & & \lambda_{34} & \lambda_{35} & \lambda_{36} \\ & & & & \lambda_{45} & \lambda_{46} \\ & & & & & \lambda_{56} \\ & & & & & \end{bmatrix}$$

In the expression above, $\lambda_{12}$ denotes a partial correlation coefficient between the monitoring data $X_1$ and the monitoring data $X_2$. In addition, because the partial correlation coefficient matrix $\Lambda$ is a symmetric matrix, some of the partial correlation coefficients $\lambda$ are omitted in the expression above. Furthermore, because the components on a main diagonal in the partial correlation coefficient matrix Λ are all 1, these components are omitted in the description.

Figure 3:
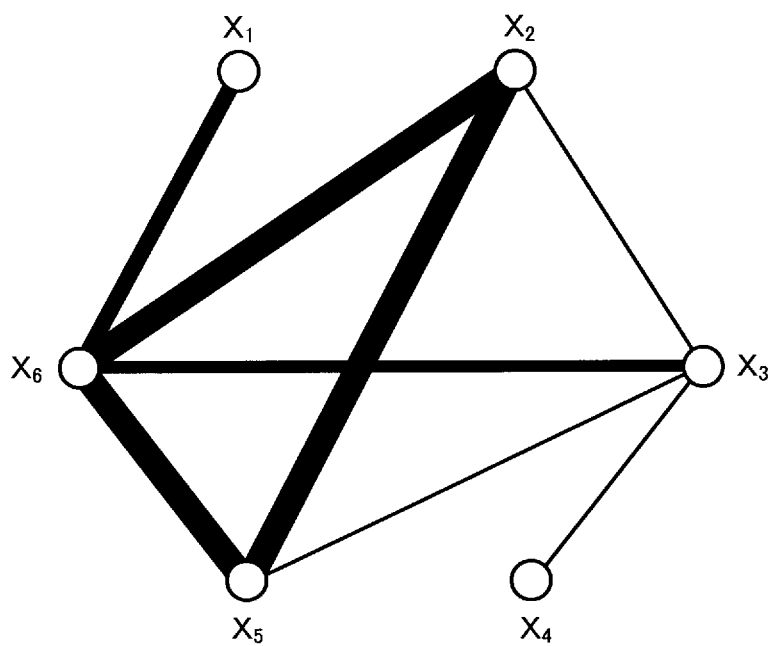
FIG. 3 is a visualization of a partial correlation coefficient matrix $\Lambda_1$ when the first secondary battery is normal, according to the first embodiment.

When the correlation between two types of monitoring data is high, the partial correlation coefficient λ becomes closer to 1 or −1. In addition, when the correlation is low, the partial correlation coefficient λ becomes closer to 0. FIG. 3 shows a visualization of the first partial correlation coefficient matrix $\Lambda_1$. As shown in FIG. 3, two types of monitoring data X that have a high correlation (such as $X_2$ and $X_6$, and $X_5$ and $X_6$) are indicated by a relatively thick line. In addition, two types of monitoring data X that have a lower correlation (such as $X_3$ and $X_6$) are indicated by a slightly thinner line.

Figure 4:
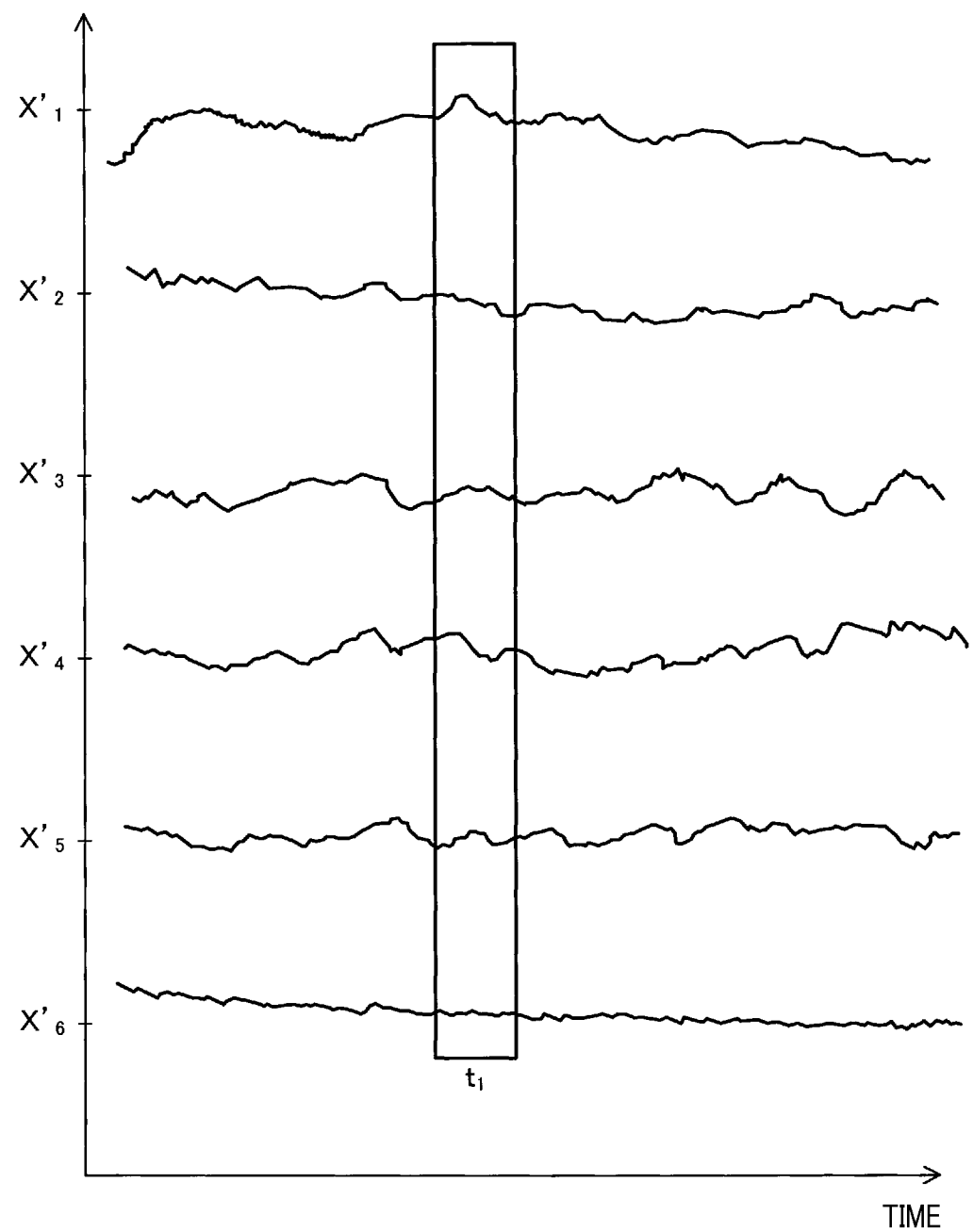
FIG. 4 is a graph of changes with time in the monitoring data of a second secondary battery according to the first embodiment.

Next, the failure determining unit 4 performs sparsity regularization again using monitoring data $X'_1$ to $X'_6$ of the second secondary battery $2_B$ (see FIG. 4). The failure diagnosing unit 5 thereby calculates a second partial correlation coefficient matrix $\Lambda_2$. As shown in FIG. 4, the values of the monitoring data $X'_1$ to $X'_6$ of the second secondary battery 2B change with the passage of time. According to the present embodiment, the two partial coefficient matrices $\Lambda_2$ and $\Lambda_2$ are respectively calculated through use of the monitoring data $X_1$ to $X_6$ and the monitoring data $X'_1$ to $X'_6$ that are acquired at a same time $t_1$ (see FIG. 2 and FIG. 4). For example, the second partial coefficient matrix $\Lambda_2$ can be expressed in the following manner.

$$\Lambda_2 = \begin{bmatrix} \lambda'_{12} & \lambda'_{13} & \lambda'_{14} & \lambda'_{15} & \lambda'_{16} \\ & \lambda'_{23} & \lambda'_{24} & \lambda'_{25} & \lambda'_{26} \\ & & \lambda'_{34} & \lambda'_{35} & \lambda'_{36} \\ & & & \lambda'_{45} & \lambda'_{46} \\ & & & & \lambda'_{56} \end{bmatrix} \quad \text{[Formula 2]}$$

Figure 5:
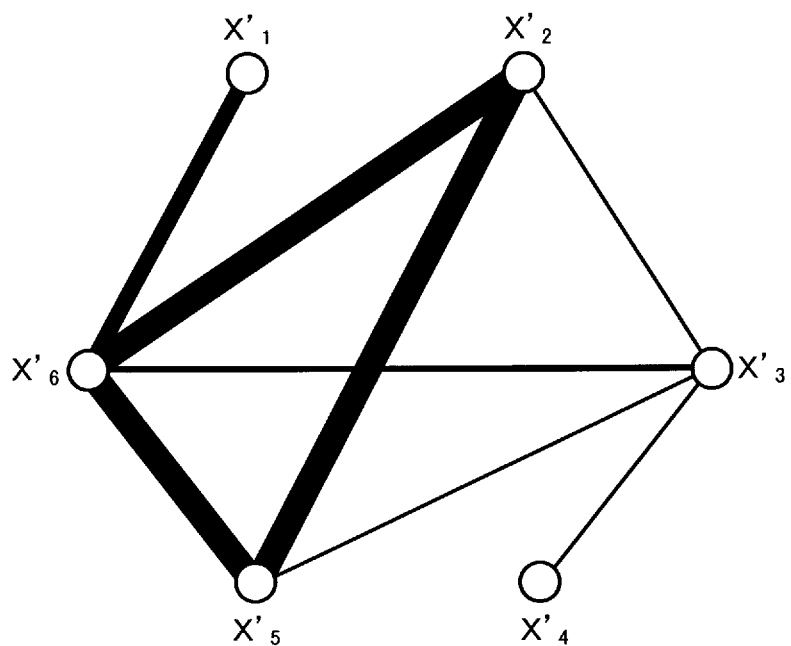
FIG. 5 is a visualization of a partial correlation coefficient matrix $\Lambda_2$ when the second secondary battery is normal, according to the first embodiment.

FIG. 5 shows a visualization of the second partial correlation coefficient matrix $\Lambda_2$. When the two secondary batteries $2_A$ and $2_B$ are both normal, the correlations between the monitoring data $X_1$ to $X_6$ of the first secondary battery $2_A$ and the correlations between the monitoring data $X'_1$ to $X'_6$ of the second secondary battery $2_B$ are substantially identical. Therefore, the two partial correlation coefficient matrices $\Lambda_1$ and $\Lambda_2$ are substantially identical. Thus, graphs (see FIG. 3 and FIG. 5) respectively visualizing the two partial correlation coefficient matrices $\Lambda_1$ and $\Lambda_2$ are substantially identical.

After calculating the two partial correlation coefficient matrices $\Lambda_1$ and $\Lambda_2$ in such a manner, the failure determining unit 4 calculates the difference in the partial correlation coefficient λ between the two partial correlation coefficient matrices $\Lambda_1$ and $\Lambda_2$ as the abnormality level Δ. For example, the abnormality level Δ can be expressed in the following manner.

$$\begin{aligned} \Delta_{12} &= |\lambda'_{12} - \lambda_{12}| \\ \Delta_{13} &= |\lambda'_{13} - \lambda_{13}| \\ &\vdots \\ \Delta_{56} &= |\lambda'_{56} - \lambda_{56}| \end{aligned} \quad \text{[Formula 3]}$$

Here, $\Delta_{12}$ denotes an abnormality level Δ of the partial correlation coefficient $\lambda_{12}$ between the two partial correlation coefficient matrices $\Lambda_1$ and $\Lambda_2$.

Figure 6:
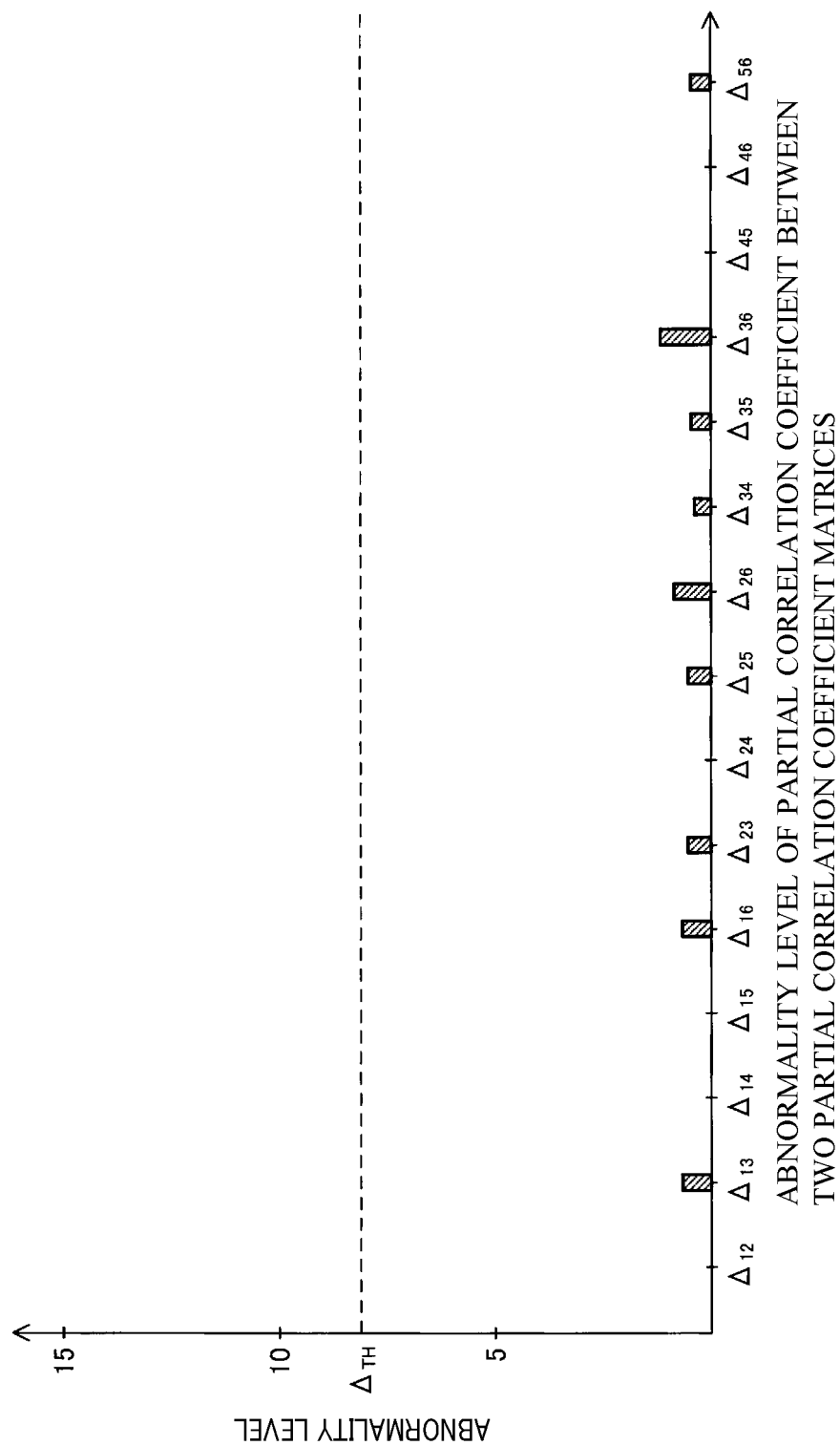
FIG. 6 is a graph of abnormality levels when the two secondary batteries are normal, according to the first embodiment.

FIG. 6 shows a graph of each of the abnormality levels Δ. As described above, when the correlations between the monitoring data $X_1$ to $X_6$ of the first secondary battery $2_A$ and the correlations between the monitoring data $X'_1$ to $X'_6$ of the second secondary battery $2_B$ have not significantly changed, the two calculated partial correlation coefficient matrices $\Lambda_1$ and $\Lambda_2$ are substantially identical. Therefore, the amount of change in the partial correlation coefficient λ is small, and the abnormality level Δ is a small value. When all abnormality levels Δ are less than the threshold $\Delta_{TH}$, the failure determining unit 4 determines that the correlations between the monitoring data X of the two secondary batteries $2_A$ and $2_B$ are identical, that is, neither of the two secondary batteries $2_A$ and $2_B$ has failed.

Figure 7:
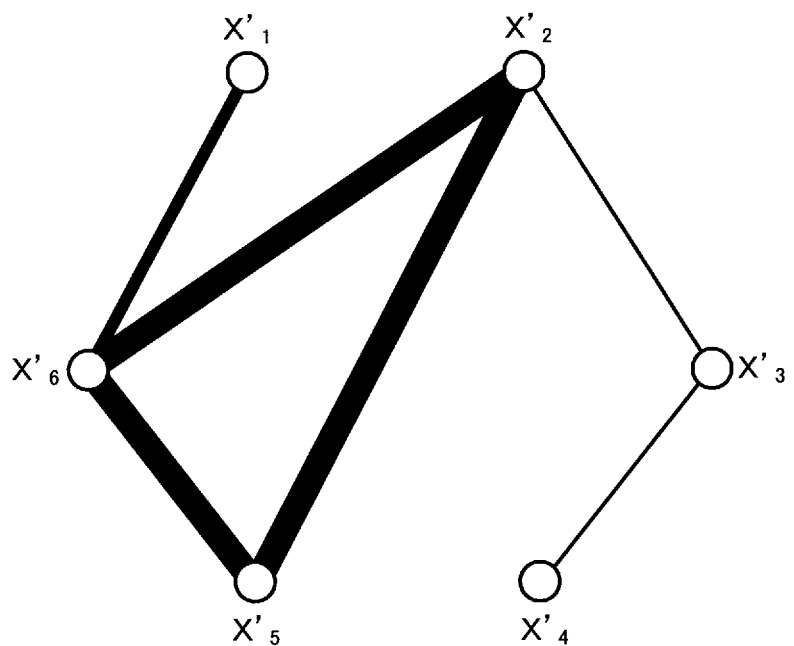
FIG. 7 is a visualization of the partial correlation coefficient matrix $\Lambda_2$ when the second secondary battery has failed, according to the first embodiment.

Next, FIG. 7 shows a graph that is a visualization of the partial correlation coefficient matrix $\Lambda_2$ when the second secondary battery $2_B$ has failed. In this graph, compared to that in FIG. 5, the correlation between the monitoring data $X'_3$ and the monitoring data $X'_5$ and the correlation between the monitoring data $X'_3$ and the monitoring data $X'_6$ are low at substantially 0.

Figure 8:
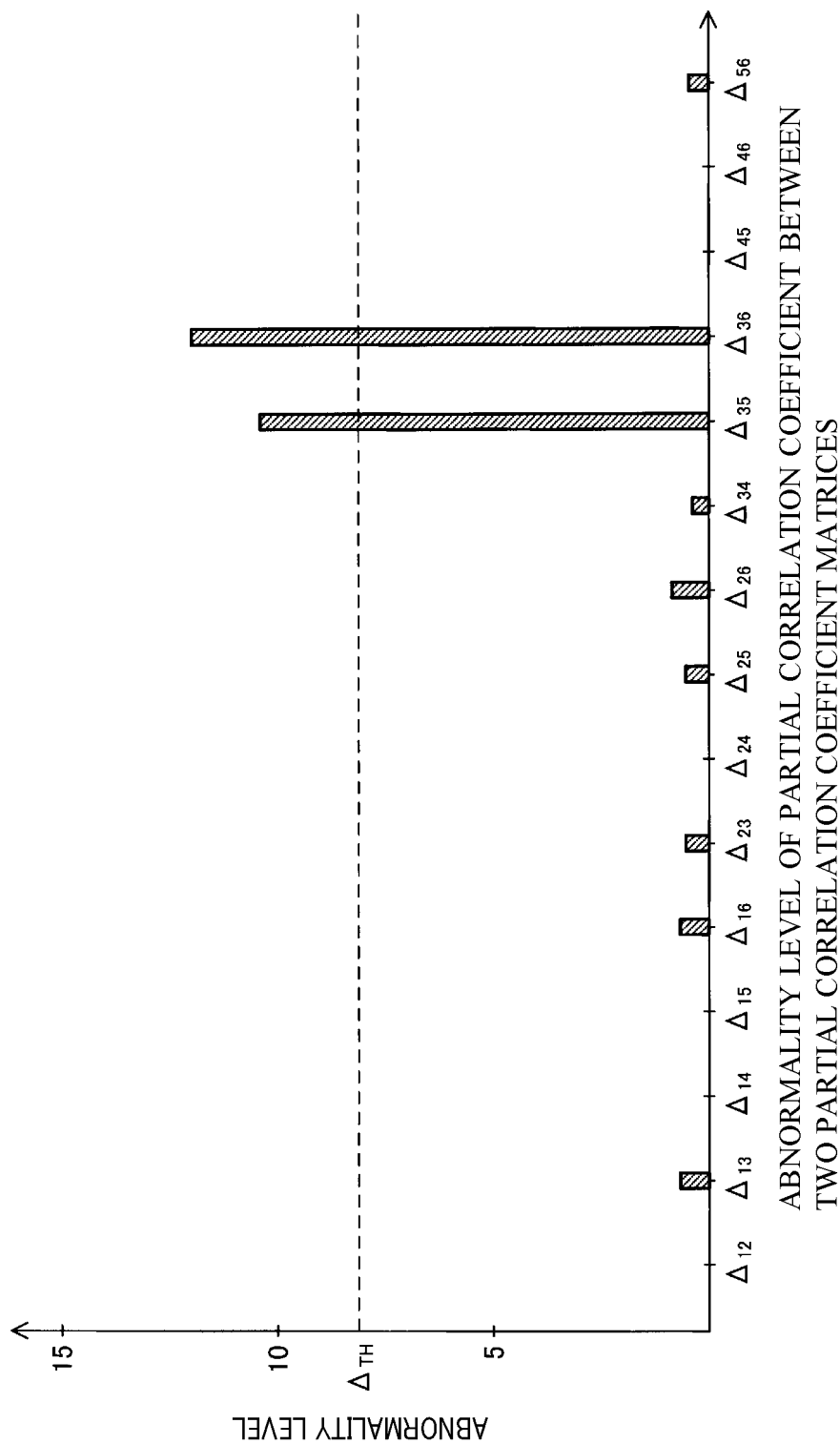
FIG. 8 is a graph of the abnormality levels when the second secondary battery has failed, according to the first embodiment.

FIG. 8 shows a graph of the abnormality levels Δ at this time. As shown in FIG. 8, the abnormality level $\Delta_{35}$ of the monitoring data $X_3$ and the monitoring data $X_5$, and the abnormality level $\Delta_{36}$ of the monitoring data $X_3$ and the monitoring data $X_6$ are high. When the calculated abnormality level Δ exceeds the threshold $\Delta_{TH}$, the failure determining unit 4 determines that the correlations between the monitoring data $X_1$ to $X_6$ differ between the two secondary batteries $2_A$ and $2_B$, that is, either of the two secondary batteries $2_A$ and $2_B$ has failed. More specifically, the failure determining unit 4 determines that one of the secondary batteries $2_A$ and $2_B$ has failed when at least one abnormality level Δ among the plurality of calculated abnormality levels $\Delta_{12}$ to $\Delta_{56}$ exceeds the threshold $\Delta_{TH}$.

Figure 11:
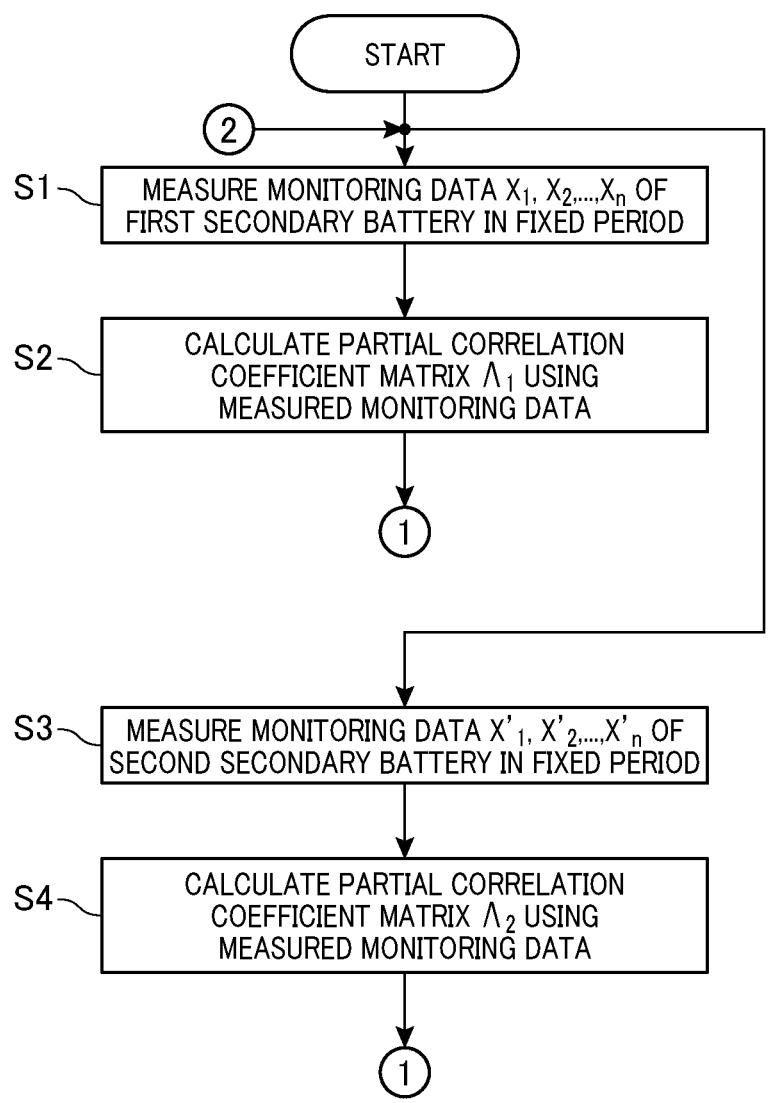
FIG. 11 is a flowchart of processes performed by a failure determining unit according to the first embodiment.
Figure 12:
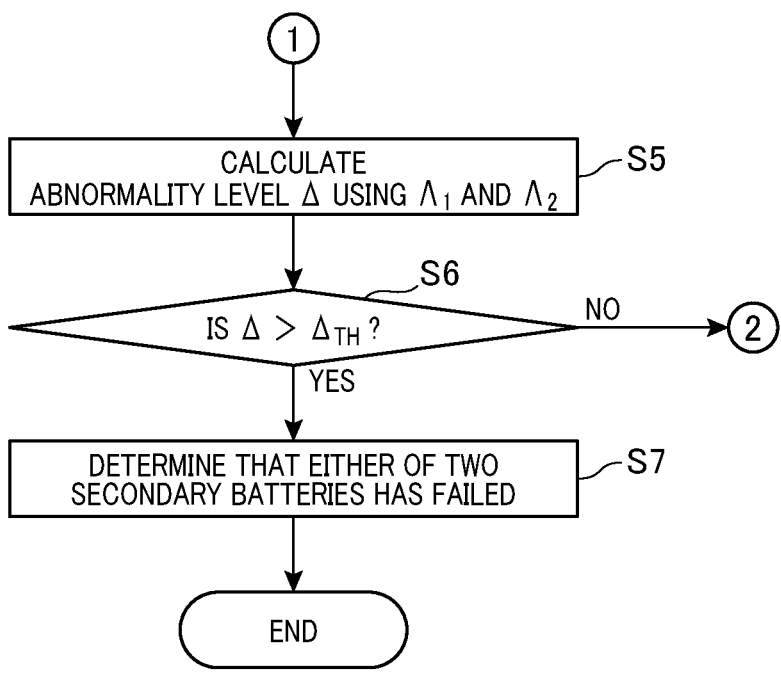
FIG. 12 is a flowchart following the flowchart in FIG. 11.

Next, a flowchart of the processes performed by the failure determining unit 4 will be described. As shown in FIG. 11, the failure determining unit 4 according to the present embodiment performs steps S1 and S2 and steps S3 and S4 in parallel. At step S1, the failure determining unit 4 measures the monitoring data $X_1$ to $X_n$ of the first secondary battery 2A in a fixed period. Then, the failure determining unit 4 proceeds to step S2. Here, the failure determining unit 4 calculates the first partial correlation coefficient matrix $\Lambda_1$ using the measured monitoring data $X_1$ to $X_n$.

In addition, at step S3, the failure determining unit 4 measures the monitoring data $X'_1$ to $X'_n$ of the second secondary battery $2_B$ in a fixed period. Then, the failure determining unit 4 proceeds to step S4. Here, the failure determining unit 4 calculates the second partial correlation coefficient matrix $\Lambda_2$ using the measured monitoring data $X'_1$ to $X'_n$.

After calculating the two partial correlation coefficient matrices $\Lambda_1$ and $\Lambda_2$ in the manner described above, the failure determining unit 4 proceeds to step S5. At step S5, the failure determining unit 4 calculates the abnormality levels Δ using the two partial correlation coefficient matrices $\Lambda_1$ and $\Lambda_2$. Next, the failure determining unit 4 proceeds to step S6 and determines whether at least one of the calculated plurality of abnormality levels Δ (see FIG. 8) exceeds the threshold $\Delta_{TH}$. When a YES determination is made at step S6 (see FIG. 7), the failure determining unit 4 proceeds to step S7 and determines that either of the two secondary batteries $2_A$ and $2_B$ has failed. In addition, when a NO determination is made at step S6, the failure determining unit 4 returns to steps S1 and S3.

Next, working effects according to the present embodiment will be described. The failure determining unit 4 according to the present embodiment performs sparsity regularization using the monitoring data of the secondary battery 2 as variables and calculates the partial correlation coefficient matrix $\Lambda$. Then, the failure determining unit 4 calculates, as the abnormality level $\Delta$, the difference in the partial correlation coefficient $\lambda$ between the two partial correlation coefficient matrices $\Lambda_1$ and $\Lambda_2$ respectively calculated using the two secondary batteries 2A and 2B. When the abnormality level $\Delta$ exceeds the threshold $\Delta_{TH}$, the failure determining unit 4 determines that the either of the two secondary batteries 2A and 2B has failed.

As a result, initial stage of failure of the secondary battery 2 can be detected.

Figure 18:
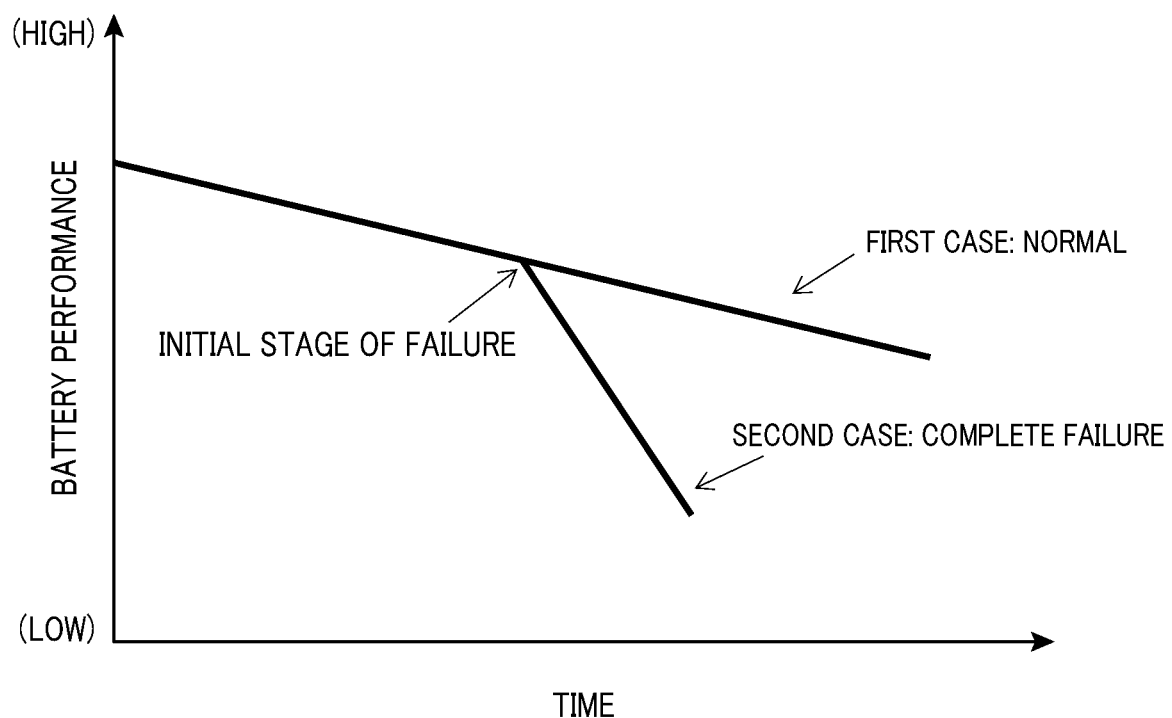
FIG. 18 is a conceptual graph of battery performance of the secondary battery changed with time in a first case where the the secondary battery is normal and in a second case where the secondary battery is failed.

FIG. 18 shows battery performance of the secondary battery changed with time in a first case where the the secondary battery is normal and in a second case where the secondary battery is failed. The battery performance may include a capacity of the the secondary battery or a resistance of the secondary battery.

Figure 15:
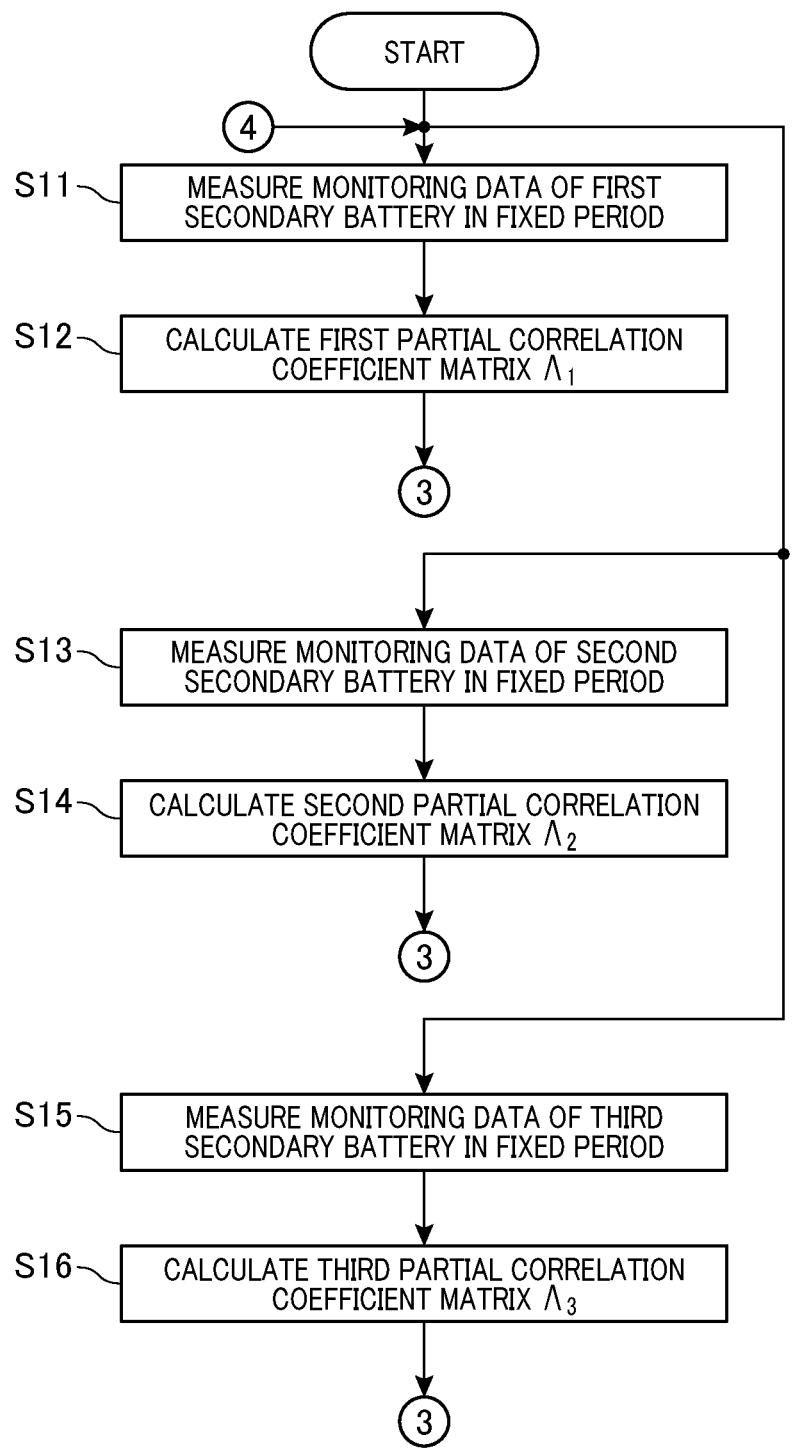
FIG. 15 is a flowchart of processes performed by a failure determining unit according to the second embodiment.
Figure 16:
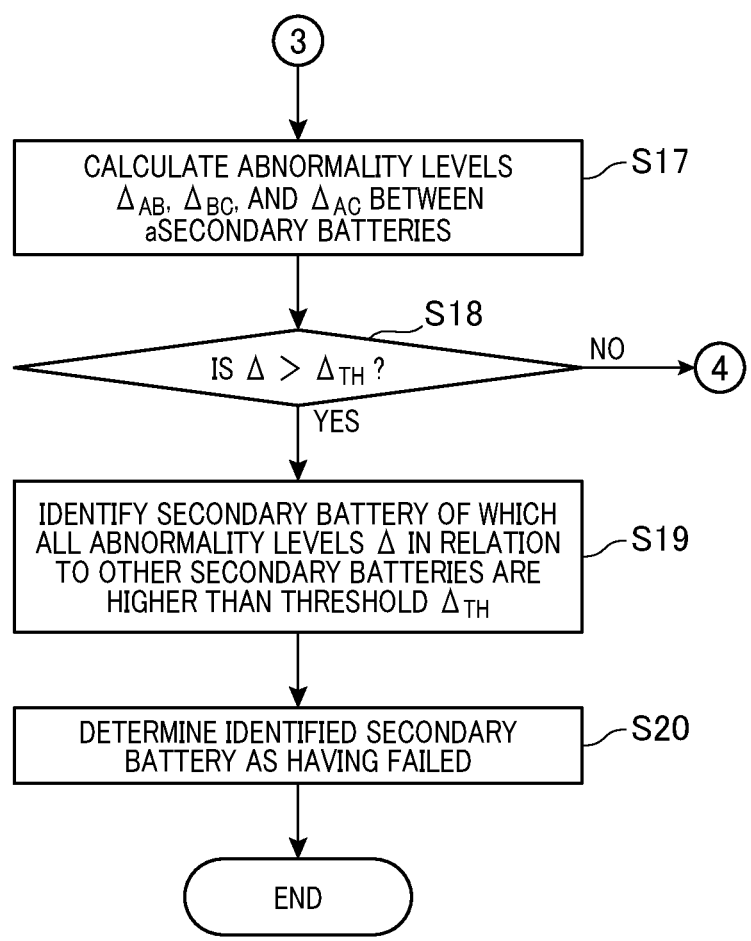
FIG. 16 is a flowchart following the flowchart in FIG. 15.

In the conventional technique, it is difficult to perform failure determination at an initial stage of failure of the secondary battery in the second case, shown in FIG. 15, where the secondary battery is completely failed. Thus, the failure determination cannot be performed at the initial stage of failure of the secondary battery when the battery performance is significantly reduced. In other words, the initial stage of failure of the secondary battery cannot be detected.

In the present embodiment, it is possible to perform failure determination at an initial stage of failure of the secondary battery in the second case, shown in FIG. 15, where the secondary battery is completely failed. Thus, the failure determination can be performed at the initial stage of failure of the secondary battery when the battery performance is significantly reduced. In other words, the initial stage of failure of the secondary battery can be detected.

That is, as described above, when sparsity regularization is performed, two types of monitoring data that have a high correlation can be selected among the plurality of types of monitoring data of the secondary battery 2. That is, when two types of monitoring data have a high correlation, the absolute value of the partial correlation coefficient $\lambda$ becomes closer to 1. In addition, when two types of monitoring data X have a low correlation, the absolute value of the partial correlation coefficient $\lambda$ becomes closer to 0.

Therefore, when the two secondary batteries $2_A$ and $2_B$ are compared and the partial correlation coefficients $\lambda$ respectively included in the partial correlation coefficient matrices $\Lambda_1$ and $\Lambda_2$ of the secondary batteries $2_A$ and $2_B$ significantly differ, this means that the combination of two types of monitoring data that have a high correlation differs between the two secondary batteries $2_A$ and $2_B$. Therefore, in this case, a determination that a failure of some sort has occurred in either of the two secondary batteries $2_A$ and $2_B$ can be made. In particular, the partial correlation coefficient $\lambda$ significantly changes even when an initial stage of failure occurs in the secondary battery 2. Therefore, initial stage of failure of the secondary battery 2 can be detected through use of the change in the partial correlation coefficient $\lambda$.

In addition, the battery monitoring system 1 according to the present embodiment is capable of performing failure detection without being required to store all pieces of monitoring data acquired in the past, as long as only the pieces of monitoring data required for the calculation of the partial correlation coefficient matrices $\Lambda$ are stored. Therefore, the amount of data to be stored can be reduced. Moreover, compared to cases where the capacity of the secondary battery 2 is measured, the battery monitoring system 1 according to the present embodiment can perform failure determination of the secondary battery 2 in a small amount of time.

In addition, as shown in FIG. 2 and FIG. 4, the matrix calculating unit 41 according to the present embodiment is configured to calculate the plurality of partial correlation coefficient matrices $\Lambda_1$ and $\Lambda_2$ using the monitoring data $X_1$ to $X_6$ and $X'_1$ to $X'_6$ acquired at the same time $t_1$.

Therefore, the two secondary batteries $2_A$ and $2_B$ at the same time period can be compared, and failure determination can be accurately performed.

Furthermore, as shown in FIG. 1, according to the present embodiment, the assembled battery 20 is configured by the two secondary batteries $2_A$ and $2_B$ being connected in series.

As a result, failure determination of each secondary battery 2 can be performed through use of the plurality of secondary batteries $2_A$ and $2_B$ configuring the assembled battery 20.

As described above, according to the present embodiment, a battery monitoring system that is capable of detecting initial stage of failure of a secondary battery, reducing an amount of data to be stored, and performing failure determination in a small amount of time can be provided.

In FIG. 2 and the like, a 6×6 partial correlation coefficient matrix $\Lambda$ is calculated through use of the six types of monitoring data $X_1$ to $X_6$. The plurality of abnormality levels $\Delta_{12}$ to $\Delta_{56}$ (see FIG. 7) are calculated based on the monitoring data $X_1$ to $X_6$. When at least one abnormality level $\Delta$ among the plurality of abnormality levels $\Delta_{12}$ to $\Delta_{56}$ exceeds the threshold $\Delta_{TH}$, the secondary battery 2 is determined to have failed. However, the present disclosure is not limited thereto. That is, a 2×2 partial correlation coefficient matrix $\Lambda$ may be calculated through use of two types of monitoring data $X_1$ and $X_2$. Only a single abnormality level $\Delta_{12}$ may then be calculated based on the monitoring data $X_1$ and $X_2$.

According to the embodiments below, reference numbers used in the drawings that are the same as those used according to the first embodiment denote constituent elements and the like that are similar to those according to the first embodiment, unless otherwise indicated.

Second Embodiment

Figure 13:
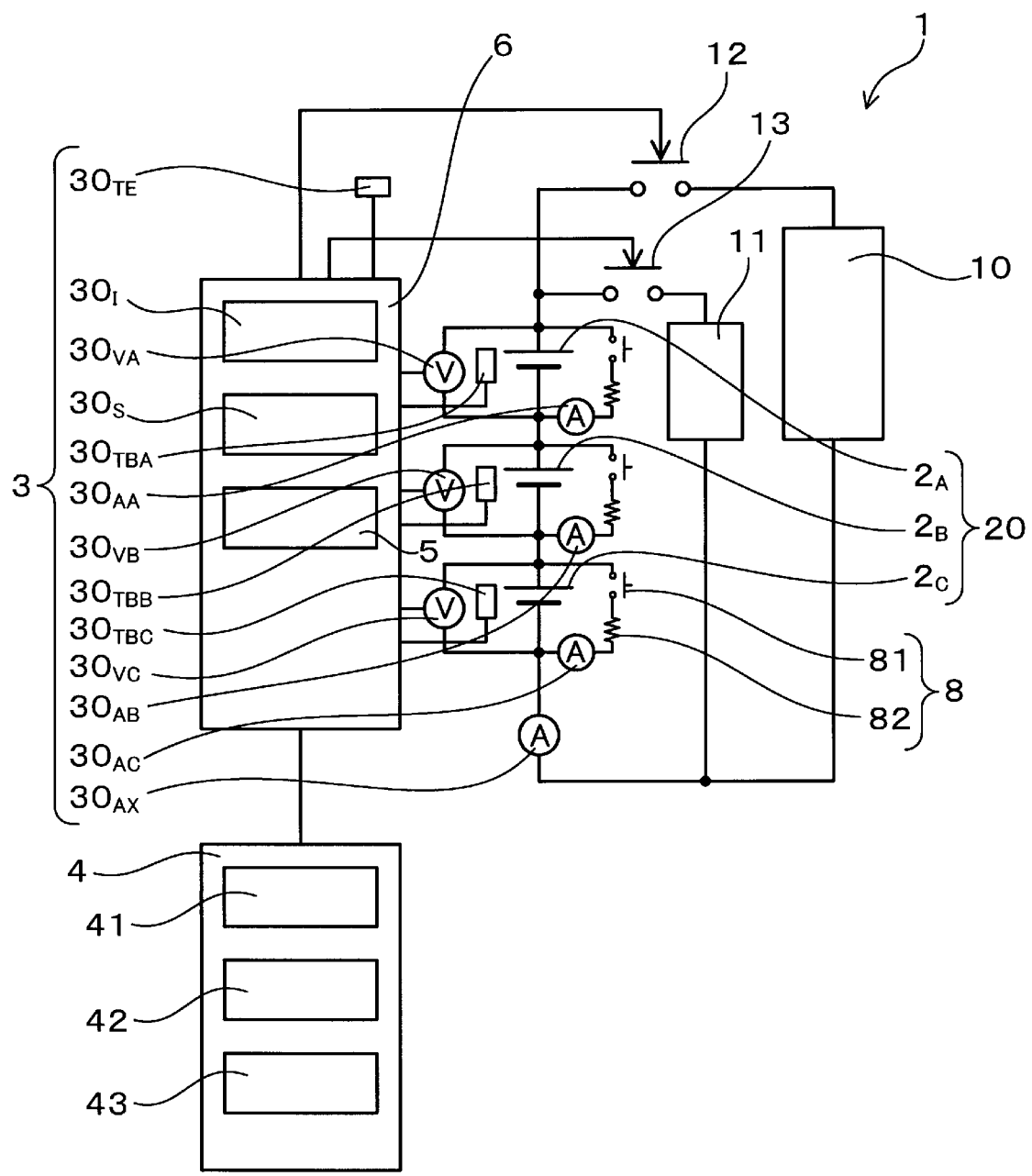
FIG. 13 is a circuit diagram of a battery monitoring system according to a second embodiment.

According to a second embodiment, an example in which the quantity of the secondary batteries 2 and the like are modified is given. As shown in FIG. 13, according to the present embodiment, three secondary batteries $2_A$ to $2_C$ are connected in series. In addition, the data acquiring unit 2 acquires the monitoring data of each of the secondary batteries $2_A$ to $2_C$. In a manner similar to that according to the first embodiment, the data acquiring unit 3 includes the voltage sensor $30_V$ ($30_{VA}$, $30_{VB}$, and $30_{VC}$), the current sensor $30_A$ ($30_{AA}$, $30_{AB}$, $30_{AC}$, and $30_{AX}$), the temperature sensor $30_{TB}$ ($30_{TBA}$, $30_{TBB}$, and $30_{TBC}$), and the like.

The matrix calculating unit 41 calculates the respective partial correlation coefficient matrices $\Lambda$ of the three secondary batteries $2_A$, $2_B$, and $2_C$. In addition, the failure determining unit 4 includes a failure identifying unit 43. The failure identifying unit 43 identifies the failed secondary battery 2 using the abnormality levels $\Delta$ between the secondary batteries 2.

Figure 14:
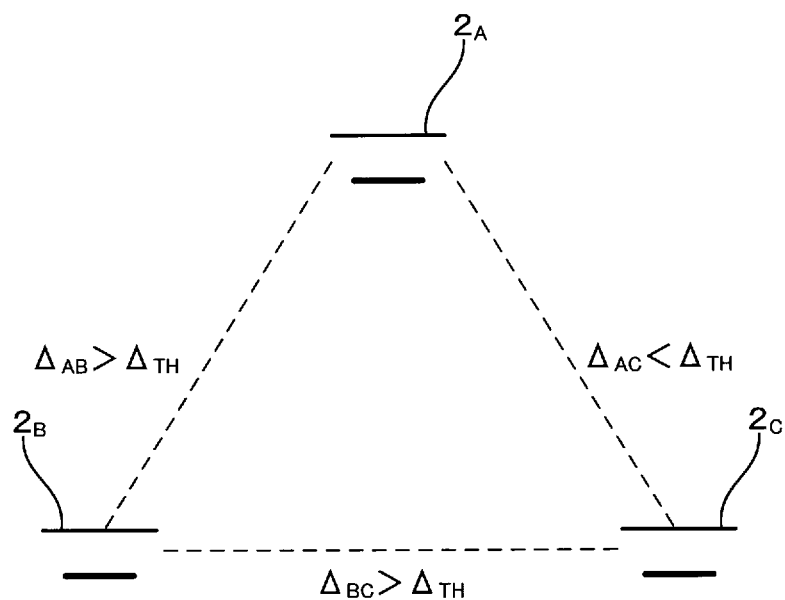
FIG. 14 is a conceptual diagram of relationships between the abnormality levels of the secondary batteries according to the second embodiment.

For example, as shown in FIG. 14, a following case is assumed. That is, the abnormality level $\Delta_{AB}$ between the first secondary battery $2_A$ and the second secondary battery $2_B$ is higher than the threshold $\Delta_{TH}$. The abnormality level $\Delta_{BC}$ between the second secondary battery $2_B$ and the third secondary battery $2_C$ is higher than the threshold $\Delta_{TH}$. The abnormality level $\Delta_{AC}$ between the first secondary battery $2_A$ and the third secondary battery $2_C$ is lower than the threshold $\Delta_{TH}$. In this case, the abnormality levels $\Delta_{AB}$ and $\Delta_{BC}$ of the second secondary battery $2_B$ in relation to the other secondary batteries 2 (that is, the first secondary battery $2_A$ and the third secondary battery $2_C$) are both higher than the threshold $\Delta_{TH}$. Therefore, the second secondary battery $2_B$ can be identified as having failed.

Next, a flowchart of the processes performed by the failure determining unit 4 will be described. As shown in FIG. 15, the failure determining unit 4 performs steps S11 to S16 in parallel. At step S11, the failure determining unit 4 measures the monitoring data of the first secondary battery $2_A$ in a fixed period. Then, the failure determining unit 4 proceeds to step S12 and calculates the first partial correlation coefficient matrix $\Lambda_1$ using the measured monitoring data.

In a similar manner, at step S13, the failure determining unit 4 measures the monitoring data of the second secondary battery $2_B$. Then, the failure determining unit 4 proceeds to step S14 and calculates the second partial correlation coefficient matrix $\Lambda_2$ using the measured monitoring data. Furthermore, at step S15, the failure determining unit 4 measures the monitoring data of the third secondary battery $2_C$. Then, the failure determining unit 4 proceeds to step S16 and calculates the third partial correlation coefficient matrix $\Lambda_3$ using the measured monitoring data.

After calculating the three partial correlation coefficient matrices $\Lambda$ in the manner described above, the failure determining unit 4 calculates the abnormality levels $\Delta$ between the secondary batteries 2. That is, the failure determining unit 4 calculates the abnormality level $\Delta_{AB}$ (refer to Formula 3, above) using the partial correlation coefficient matrix $\Lambda_1$ of the first secondary battery $2_A$ and the partial correlation coefficient matrix $\Lambda_2$ of the second secondary battery $2_B$. In a similar manner, the failure determining unit 4 calculates the abnormality level $\Delta_{BC}$ between the second secondary battery $2_B$ and the third secondary battery $2_C$. Furthermore, the failure determining unit 4 calculates the abnormality level $\Delta_{AC}$ between the first secondary battery $2_A$ and the third secondary battery $2_C$.

Subsequently, the failure determining unit 4 proceeds to step S18. Here, the failure determining unit 4 determines whether any of the abnormality levels $\Delta_{AB}$, $\Delta_{BC}$, and $\Delta_{AC}$ exceeds the threshold $\Delta_{TH}$. When a NO determination is made at step S18, the failure determining unit 4 returns to step S11. In addition, when a YES determination is made at step S18, the failure determining unit proceeds to step S19. Here, the failure determining unit 4 determines the secondary battery 2 of which all abnormality levels $\Delta$ are higher than the threshold $\Delta_{TH}$. Then, the failure determining unit proceeds to step S20. Here, the failure determining unit 4 determines that the identified secondary battery 2 has failed.

Working effects according to the present embodiment will be described. According to the present embodiment, the respective partial correlation coefficient matrices $\Lambda$ are calculated for the three secondary batteries $2_A$, $2_B$, and $2_C$. In addition, the failure identifying unit 43 identifies the failed secondary battery 2 using the abnormality levels $\Delta_{AB}$, $\Delta_{BC}$, and $\Delta_{AC}$ between the secondary batteries $2_A$, $2_B$, and $2_C$.

When the two secondary batteries $2_A$ and $2_B$ are used as according to the first embodiment, when the abnormality level $\Delta$ exceeds the threshold $\Delta_{TH}$, the secondary battery 3 that has failed cannot be identified. However, when the three secondary batteries $2_A$, $2_B$, and $2_C$ are used as according to the present embodiment, the secondary battery of which all abnormality levels $\Delta$ exceed the threshold $\Delta_{TH}$ can be identified as having failed.

Furthermore, according to the present embodiment, configurations and working effects similar to those according to the first embodiment are also provided.

According to the present embodiment, three secondary batteries $2_B$, and $2_C$ are used. However, the present disclosure is not limited thereto. Four or more secondary batteries 2 may be used.

Third Embodiment

Figure 17:
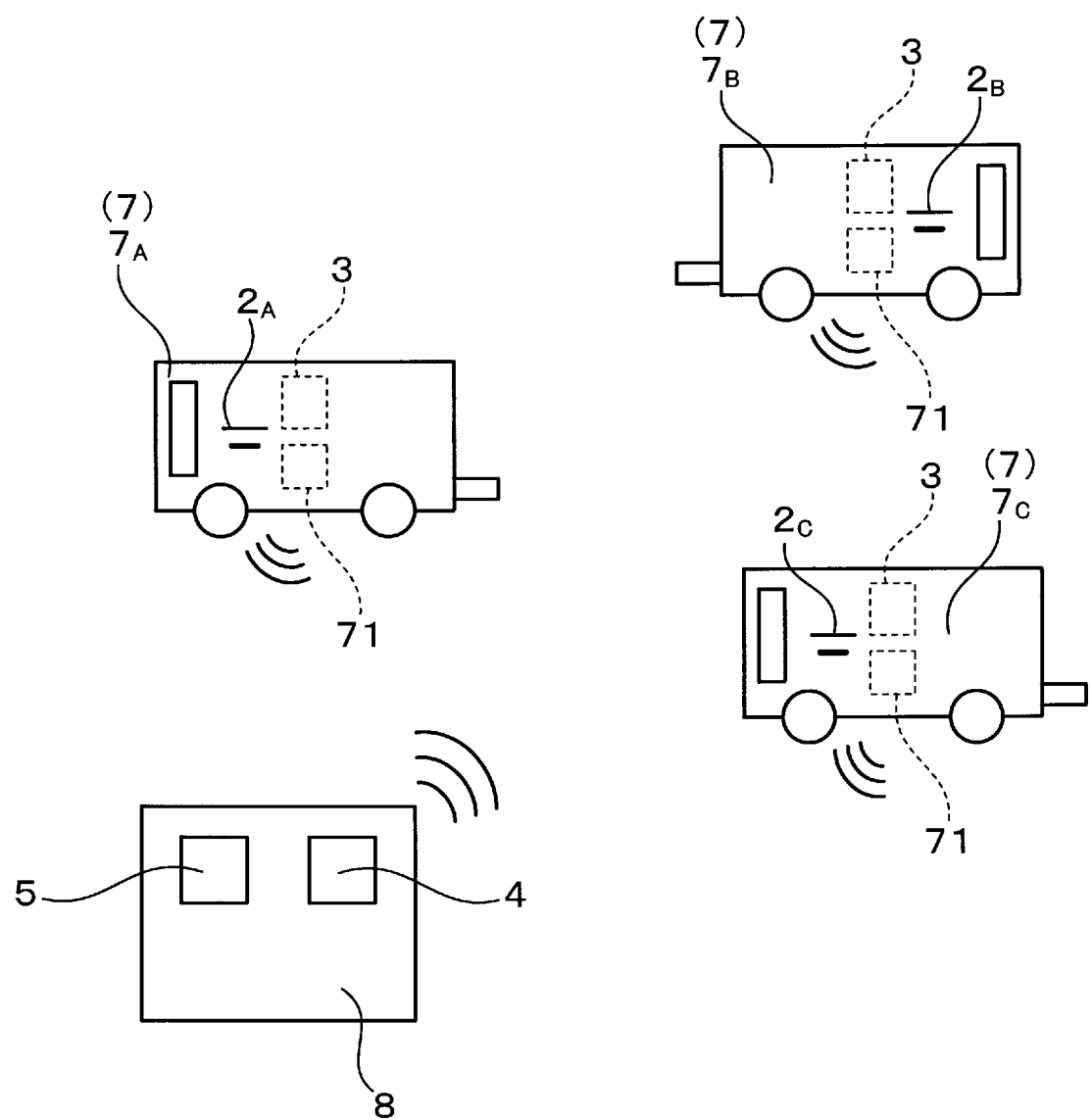
FIG. 17 is a conceptual diagram of a battery monitoring system according to a third embodiment.

According to a third embodiment, an example in which the arrangement positions of the secondary batteries 2 are modified is given. As shown in FIG. 17, the plurality of secondary batteries 2 ($2_B$, and $2_C$) are mounted in separate vehicles 7. The data acquiring unit 3 that acquires the monitoring data of the secondary battery 2 is mounted in each vehicle 7.

The failure determining unit 4 and the storage unit 5 are provided in an external apparatus 8 (such as a server). A transmission/reception apparatus 71 that transmits and receives data is mounted in each vehicle 7. The monitoring data is transmitted to the external apparatus 8 through use of the transmission/reception apparatus 7. The failure determining unit 4 calculates the partial correlation coefficient matrices $\Lambda$ and the abnormality levels $\Delta$ using the transmitted monitoring data. Then, in a manner similar to that according to the second embodiment, the failure determining unit 4 identifies the failed secondary battery 2 using the calculated abnormality levels $\Delta$.

Working effects according to the present embodiment will be described. According to the present embodiment, the secondary batteries 2 are mounted in separate vehicles 7. As a result, failure determination of each secondary battery 2 can be performed through use of the secondary battery 2 that is mounted in each vehicle 7. Therefore, failure determination can be performed even when only a single secondary battery 2 is mounted in each vehicle 7.

In addition, when the secondary battery 2 is monitored in only a single vehicle 7 and only a single system of the data acquiring unit 3 is provided, if the data acquiring unit 3 fails, the monitoring data may appear to have not changed. In this case, failures in the secondary battery 2 and the data acquiring unit 3 may not be accurately detected.

In this regard, when the secondary battery 2 and the data acquiring unit 3 are provided in each vehicle 7 as according to the present embodiment, because a plurality of systems of the data acquiring unit 3 are present, if the data acquiring unit 3 of any of the vehicles 7 fails, the failure in the data acquiring unit 3 can be detected. That is, as a result of the secondary batteries 2 and the data acquiring units 3 being arranged to be dispersed among the vehicles 7, and the secondary batteries 2 being mutually monitored as according to the present embodiment, failure determination of a power supply system including the data acquiring unit 3 (sensors) can be performed.

Furthermore, according to the present embodiment, configurations and working effects similar to those according to the first embodiment are also provided.

The present disclosure is not limited to the above-described embodiments. Various embodiments are applicable without departing from the spirit of the present disclosure.

What is claimed is:

1. A system comprising:
a server;
a first vehicle and a second vehicle, each vehicle comprising:
a secondary battery;
an inverter that is connected to the secondary battery and configured to convert direct current from the secondary battery into alternating current;
a motor that is connected to the inverter, and configured to drive the vehicle using the alternating current from the inverter;
a plurality of sensors including a current sensor, a voltage sensor, a battery temperature sensor, the current sensor being configured to measure a discharge current or a charge current of the secondary battery, the voltage sensor being configured to measure a closed-circuit voltage or open-circuit voltage of the secondary battery, the plurality of sensors being configured to acquire a plurality of types of monitoring data to monitor a state of the secondary battery;
a memory operatively coupled to the plurality of sensors, the memory storing only an amount of the acquired plurality of types of monitoring data required to calculate a partial correlation coefficient matrix of the monitoring data; and
a processor configured to:
acquire the stored monitoring data stored in the memory, and transmit the stored monitoring data to the server,
wherein the server is configured to:
receive the stored monitoring data from the first vehicle and the second vehicle,
perform sparsity regularization using the stored monitoring data of each of the secondary batteries as variables, and calculate the partial correlation coefficient matrix of the stored monitoring data,
calculate, as an abnormality level, a difference in a partial correlation coefficient, which is a component of the calculated partial correlation coefficient matrix, between two partial correlation coefficient matrices respectively calculated using the stored monitoring data of the two secondary batteries, and
determine, by mutually monitoring states of the secondary battery in each vehicle, that either of the two secondary batteries has failed when the calculated abnormality level exceeds a predetermined threshold,
wherein the calculation of the partial correlation coefficient matrix of the stored monitoring data comprises calculating a plurality of partial correlation coefficient matrices using the monitoring data acquired at a same time.

2. The system according to claim 1, wherein the server is configured to:
respectively calculate the partial correlation coefficient matrices for at least three secondary batteries, including the secondary batteries; and
identify at least one secondary battery that has failed using the abnormality levels between the at least three secondary batteries.

3. The system according to claim 2, wherein a plurality of secondary batteries, including the three secondary batteries, are connected to each other in series in each of the first vehicle and the second vehicle, and the plurality of secondary batteries and form an assembled battery in each of the first vehicle and the second vehicle.

4. The system according to claim 1, wherein a plurality of secondary batteries are connected to each other in series in each of the first vehicle and the second vehicle, and the plurality of secondary batteries form an assembled battery in each of the first vehicle and the second vehicle.

5. A method for monitoring, with a server, a first vehicle and a second vehicle, each vehicle including a secondary battery; an inverter that is connected to the secondary battery and configured to convert direct current into alternating current, a motor that is connected to the inverter, and configured to drive the vehicle using the alternating current, a plurality of sensors including a current sensor, a voltage sensor, a battery temperature sensor, the current sensor being configured to measure a discharge current or a charge current of the secondary battery, the voltage sensor being configured to measure a closed-circuit voltage or open-circuit voltage of the secondary battery, the method comprising:
acquiring, by a data acquiring device that is mounted in each of the first vehicle and the second vehicle, a plurality of types of monitoring data from the plurality of sensors to monitor a state of the secondary battery mounted in each vehicle,
storing, in a memory that is mounted in each of the first vehicle and the second vehicle, only an amount of the acquired plurality of types of monitoring data required to calculate a partial correlation coefficient matrix of the monitoring data;
acquiring, by the server, the stored monitoring data stored in the memory from the first vehicle and the second vehicle;
performing, by the server, sparsity regularization using the stored monitoring data of each of the secondary batteries as variables, and calculating the partial correlation coefficient matrix of the stored monitoring data;
calculating, by the server, as an abnormality level, a difference in a partial correlation coefficient, which is a component of the calculated partial correlation coefficient matrix, between two partial correlation coefficient matrices respectively calculated using the stored monitoring data of the secondary batteries; and
determining, by the server, and by mutually monitoring states of the secondary battery in each vehicle, that either of the secondary batteries has failed when the calculated abnormality level exceeds a predetermined threshold,
wherein the calculating the partial correlation coefficient matrix of the stored monitoring data comprises calculating a plurality of partial correlation coefficient matrices using the monitoring data acquired at a same time.

* * * * *